(12) United States Patent
Tomoda et al.

(10) Patent No.: US 8,232,640 B2
(45) Date of Patent: Jul. 31, 2012

(54) DEVICE, METHOD OF MANUFACTURING DEVICE, BOARD, METHOD OF MANUFACTURING BOARD, MOUNTING STRUCTURE, MOUNTING METHOD, LED DISPLAY, LED BACKLIGHT AND ELECTRONIC DEVICE

(75) Inventors: Katsuhiro Tomoda, Kanagawa (JP); Shiyuki Kanisawa, Tochigi (JP); Hidetsugu Namiki, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 363 days.

(21) Appl. No.: 11/778,736

(22) Filed: Jul. 17, 2007

(65) Prior Publication Data

US 2008/0017873 A1      Jan. 24, 2008

(30) Foreign Application Priority Data

Jul. 18, 2006   (JP) ................. P2006-195051

(51) Int. Cl.
*H01L 23/48*      (2006.01)
*H01L 29/22*      (2006.01)

(52) U.S. Cl. ............... 257/737; 257/778; 257/E23.069; 257/99

(58) Field of Classification Search .............. 257/737, 257/778, E23.069, 99
See application file for complete search history.

(56) References Cited

U.S. PATENT DOCUMENTS

| | | | | |
|---|---|---|---|---|
| 4,963,002 A | * | 10/1990 | Tagusa et al. | 349/149 |
| 5,431,328 A | * | 7/1995 | Chang et al. | 228/180.22 |
| 5,477,087 A | * | 12/1995 | Kawakita et al. | 257/737 |
| 5,956,235 A | * | 9/1999 | Kresge et al. | 361/774 |
| 6,063,647 A | * | 5/2000 | Chen et al. | 438/108 |
| 6,249,051 B1 | * | 6/2001 | Chang et al. | 257/737 |
| 6,930,399 B2 | * | 8/2005 | Paik et al. | 257/783 |
| 6,975,035 B2 | * | 12/2005 | Lee | 257/778 |
| 2002/0100974 A1 | * | 8/2002 | Uchiyama | 257/737 |
| 2003/0102570 A1 | * | 6/2003 | Imasu et al. | 257/778 |

(Continued)

FOREIGN PATENT DOCUMENTS

JP      HEI 01-192125       8/1989

(Continued)

OTHER PUBLICATIONS

Japanese Office Action issued Oct. 25, 2011, for corresponding Japanese Appln. No. 2006-195051.

*Primary Examiner* — Nitin Parekh
(74) *Attorney, Agent, or Firm* — K&L Gates LLP

(57) ABSTRACT

A mounting structure and a mounting method which are capable of securely electrically connecting wiring on a board and a device to each other in the case where the device is mounted on the board, and are capable of forming a finer bump, and increasing the number of pins are provided. A device includes at least one projection having a structure in which a surface of at least a tip part of a projecting section made of an elastic body is coated with a conductive film.

8 Claims, 18 Drawing Sheets

U.S. PATENT DOCUMENTS

| | | | |
|---|---|---|---|
| 2003/0164548 A1* | 9/2003 | Lee | 257/738 |
| 2004/0149479 A1* | 8/2004 | Chiu et al. | 174/52.2 |
| 2004/0171193 A1* | 9/2004 | Hayashida | 438/118 |
| 2004/0212098 A1* | 10/2004 | Pendse | 257/778 |
| 2005/0062153 A1* | 3/2005 | Saito et al. | 257/737 |
| 2006/0091539 A1* | 5/2006 | Tanaka | 257/737 |
| 2007/0029671 A1* | 2/2007 | Yamasaki | 257/737 |
| 2011/0260321 A1* | 10/2011 | Pendse | 257/737 |

FOREIGN PATENT DOCUMENTS

| JP | HEI 11-251363 | 9/1999 |
|---|---|---|
| JP | 2001-217281 | 8/2001 |
| JP | 2001-223243 | 8/2001 |
| JP | 2005-144745 | 6/2005 |

* cited by examiner

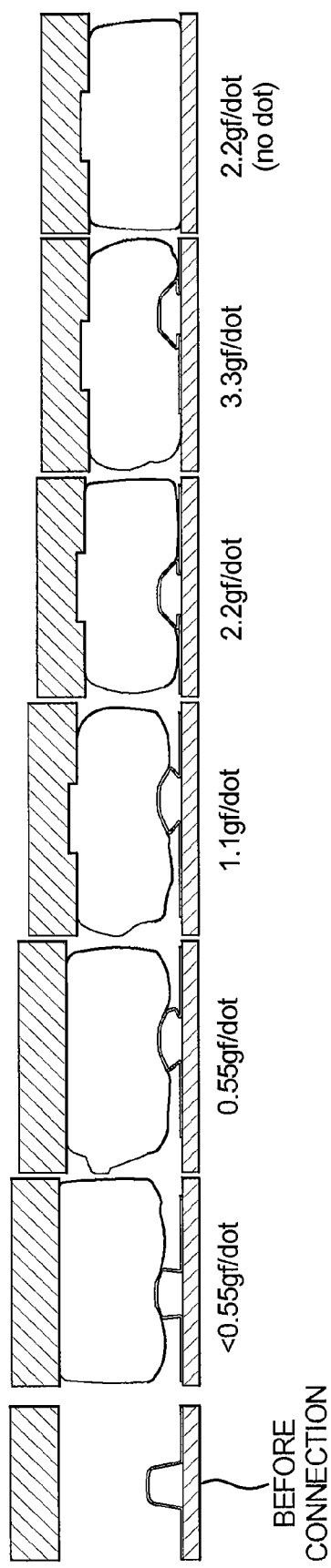

DEVICE, METHOD OF MANUFACTURING DEVICE, BOARD, METHOD OF MANUFACTURING BOARD, MOUNTING STRUCTURE, MOUNTING METHOD, LED DISPLAY, LED BACKLIGHT AND ELECTRONIC DEVICE

CROSS REFERENCES TO RELATED APPLICATIONS

The present application claims priority to Japanese Patent Application JP 2006-195051 filed in the Japanese Patent Office on Jul. 18, 2006, the entire contents of which being incorporated herein by reference.

BACKGROUND

The present disclosure relates to a device, a method of manufacturing a device, a board, a method of manufacturing a board, a mounting structure, a mounting method, an LED display, an LED backlight and an electronic device.

In related arts, as a method of electrically connecting wiring formed on a board and a device to each other, there are various methods such as solder bonding, bonding by compression, connection using a conductive paste, bonding using a non-conductive paste and the like; however, they have the following disadvantages.

In solder bonding, for example, it is necessary to increase the temperature of solder to a solder melting temperature of approximately 250° C. to 300° C., so it is necessary for a device and a board to have heat resistance to the temperature. Moreover, because of a difficulty in forming a fine solder bump, the spread of the melted solder, or the like, for example, it is difficult to achieve a wiring connection with a narrow pitch of approximately 30 µm.

In bonding by compression, typically, a newly-formed surface of the bump and a newly-formed surface of the wiring are contacted with each other and bonded together by applying both of pressure and ultrasonic vibration to a joint surface. However, for example, in the case where the size of a chip is as large as approximately 30 mm×30 mm, it is difficult to uniformly apply ultrasonic vibration, thereby it is difficult to achieve a multi-pin connection. Further, for example, in the case where the bump is as small as approximately 10 µm×10 µm, the connection principle does not work with ultrasonic waves with an amplitude of approximately 20 µm, so it is difficult to form a fine bump.

In connection using a conductive paste, typically, conductivity is developed by a conductive filler, so connection using a conductive paste is applicable only to the connection between bumps or wirings which are sufficiently larger than the size of the filler. A typical conductive filler such as carbon or silver has a diameter of approximately 1 µm at the minimum; however, such a conductive filler has a particle size distribution, and, for example, particles with a diameter of approximately 50 µm are mixed in the filler. Therefore, connection using a conductive paste is not suitable for the connection of a bump or wiring with a size of, for example, 100 µm or less. Moreover, typically, the conductive paste has poor adhesion, so it is difficult to obtain a highly reliable connection.

Bonding using a non-conductive paste is suitable to form a fine bump; however, it is difficult to ensure the reliability against a stress such as a thermal cycle.

As a technique of achieving a fine multi-pin connection which is difficult to achieve in the above related arts, a connection technique using an anisotropic conductive film (ACF) in which conductive particles with a diameter of approximately 5 µm are diffused into a thermoset film has been developed (for example, refer to Japanese Unexamined Patent Application Publication No. 2005-144745), and as of now, the connection of approximately 1000 pins with a pitch of approximately 30 µm is achieved.

However, in the connection technique using the above-described anisotropic conductive film, the capture rate of conductive particles by bumps finely formed is reduced, or it is difficult to absorb variations in heights of bumps in the case where conductive particles become smaller, so there are a large number of issues which need to be resolved to form finer bumps and increase the number of pins.

In view of the foregoing, it is desirable to provide a mounting structure and a mounting method which are capable of securely electrically connecting wiring on a board and a device to each other in the case where the device is mounted on the board, and are capable of forming a finer bump, and increasing the number of pins.

Moreover, it is desirable to provide a device and a board suitably applied to the above-described mounting structure and the above-described mounting method, and methods of manufacturing the device and the board.

Further, it is desirable to provide an LED display, an LED backlight and an electronic device on the basis of the above-described mounting structure.

SUMMARY

According to a first embodiment, there is provided a device including at least one projection having a structure in which a surface of at least a tip part of a projecting section made of an elastic body is coated with a conductive film.

In this case, the number of projections is appropriately determined, for example, depending on the planar shape, the area or the like of the bump in the case where the device is mounted through the use of the bump on the board, and the number of projections may be one, or two or more; however, typically three or less projections is sufficient. The size (the height and the width) of the projection is appropriately determined, for example, depending on the planar shape, the area or the like of the bump in the case where the device is mounted through the use of the bump on the board. Basically, the projection may have any planar shape or any sectional shape, and the shape of the projection is determined as necessary. More specifically, the projection has, for example, the shape of a truncated cone, a truncated quadrangular pyramid or the like.

As the elastic body of which the projecting section is made, basically any elastic body may be used, and is selected as necessary. Preferably, an elastic body having a compressive elastic modulus at which the projecting section is elastically deformed when the projection is compressed by a load applied at the time of mounting the device, and necessary repulsion can be obtained is used. As the material of the elastic body, an organic material is typically, but not exclusively, used. Further, the elastic body may be non-conductive or conductive.

Examples of the organic material used for the elastic body include poly-p-phenylenebenzobisoxazole (PBO), a polystyrene resin, a melamine resin, polyimide, an acrylic resin, a methacrylate resin, polymethyl methacrylate, an ABS resin, polycarbonate, polystyrene, polyethylene, polypropylene, polyacetal, a polyurethane resin, polyester, silicone rubber, an epoxy resin, an organic silicone compound having a siloxane bond and the like, and two or more kinds selected from them may be used. In addition to them, a foam material, more specifically, for example, expanded polystyrene, expanded polyethylene or a mixture thereof may be used, and they are specifically preferable in the case where an elastic body having high elasticity and flexibility is obtained. As the organic material, for example, an organic conductive material which is deformed by capturing ions, for example, a heteroaromatic cyclic conductive polymer, more specifically polypyrrole, polythiophene, polyaniline or the like may be used. Further, as the organic material, a polymer gel material may be used. As the compressive elastic modulus of some of the organic materials, PBO has a compressive elastic modulus of 2 to 3 GPa, the polystyrene resin and the melamine resin have a compressive elastic modulus of 2 to 12 GPa, and the silicone rubber has a compressive elastic modulus of 1 to 100 MPa.

Typically, the device includes at least one electrode, and the projection is arranged on the electrode in a state in which the electrode and the conductive film laid over the surface of the projecting section are conducted to each other; however, in the case where the projecting section is made of a conductive elastic body, it is not necessary to do so. Moreover, for example, in the case where the device is mounted on the board, the electrode and the conductive film laid over the surface of the projecting section may be conducted only at the time of burying at least a tip part of the projection in the bump arranged on the board.

Further, a bump may be arranged on the electrode of the device, and a projection may be arranged on the bump.

The size (the height and the width) of the projecting section is selected so that the projecting section is elastically deformed when the projection is compressed by a load applied at the time of mounting the device, and the projecting section can obtain necessary repulsion. Basically the projecting section has any planar shape or any sectional shape, and the shape of the projecting section is selected as necessary. More specifically, the projecting section may have, for example, the shape of a truncated cone, a truncated quadrangular pyramid or the like.

As the material of the conductive film laid over the projecting section, basically any material may be used, and the material of the conductive film is selected as necessary. For example, in the case where the device is mounted through the use of the bump on the board, in consideration of the balance with a bump material (for example, Au, solder or the like), a material having a mechanical strength (specifically hardness) capable of burying at least a tip part of the projection in the bump on the board, and having sufficiently low connection resistance to the bump (for example, 100Ω or less, preferably 30Ω or less, more preferably 20Ω or less, more preferably 5Ω or less), and having resistivity capable of obtaining good electrical connection is used. More specifically, the conductive film is made of, for example, any kind of metal (the simple substance or an alloy of metal), a conductive oxide or the like. Specific examples of metal include, but not limited to, Au, Al, Cu and the like. Specific examples of the conductive oxide include, but not limited to, an indium-tin oxide (ITO) and the like. The conductive film is preferably but not necessarily arranged so as to be laid over the whole surface of the projecting section.

Basically, the device may be any device, but the device may be, for example a light-emitting device (such as an LED, a semiconductor laser or an electroluminescence (EL) device), a light-receiving device (such as a photodiode, a CCD sensor or a MOS sensor), an electronic device (such as an IC chip) or the like. In addition to a semiconductor device (such as a light-emitting device, a light-receiving device or an electron transistor), the device includes various kinds of devices such as a piezoelectric device, a pyroelectric device, an optical device (such as a second harmonic generator using nonlinear optical crystal or the like), a dielectric device (including a ferroelectric device) and a superconducting device. The size (the chip size) of the device is not specifically limited.

According to a second embodiment, there is provided a method of manufacturing a device including the step of: forming at least one projecting section made of an elastic body on a device, and forming at least one projection by coating the surface of at least a tip part of the projecting section with a conductive film.

In this case, as a method of forming the projecting section, basically any method may be used, and the method is selected as necessary. For example, a method in which after a film made of an elastic body is formed, patterning of the film is performed by photolithography and etching, a printing method (such as a contact printing method, an imprint method, screen printing, gravure printing or offset printing) or the like can be used.

In addition to the above descriptions, the descriptions related to the first embodiment of the invention also apply to the second embodiment.

According to a third embodiment, there is provided a board including at least one projection having a structure in which the surface of at least a tip part of a projecting section made of an elastic body is coated with a conductive film.

Typically, wiring (including an electrode) is arranged on the board, and the projection is arranged on the wiring in a state in which the wiring and the conductive film laid over the surface of the projecting section are conducted to each other. As the material of the board, basically any material may be used, and the material of the board is selected as necessary. Examples of the material include glass, plastic and the like. The board may have any of a plate shape, a film shape and a tape shape.

The bump may be arranged on the wiring on the board, and the projection may be arranged on the bump.

In addition to the above descriptions, the descriptions related to the first embodiment also apply to the third embodiment as long as they do not contradict the nature of the third embodiment.

According to a fourth embodiment, there is provided a method of manufacturing a board including: forming at least one projecting section made of an elastic body on a board, and forming at least one projection by coating the surface of at least a tip part of the projecting section with a conductive film.

In addition to the above descriptions, the descriptions related to the first, second and third embodiments also apply to the fourth embodiment as long as they do not contradict the nature of the fourth embodiment.

According to a fifth embodiment, there is provided a mounting structure including at least one device being mounted on a board including at least one bump, the device including at least one projection having a structure in which the surface of a projecting section made of an elastic body is coated with a conductive film, wherein at least a tip part of the projection is buried in the bump.

In this case, typically, the board and the device are bonded and fixed together by an adhesive. As the adhesive, basically any adhesive may be used, and the adhesive is selected as necessary; however, an adhesive being capable of temporarily mounting (temporarily fixing) the device through the use of the adhesion of the adhesive in a state in which the adhesive is not yet cured, and being capable of securely fixing the board and the device together after the adhesive is cured is preferably used. The adhesive may have any kind of form such as a paste and a film. As the adhesive, typically an adhesive made of a resin (an adhesive resin) is used. The adhesive resin is preferably, but not necessarily, a thermoset resin. As the thermoset resin, an epoxy resin, a phenolic resin, a urea resin, a melamine resin, an unsaturated polyester resin, a polyurethane resin, polyimide or the like is used.

The number of devices mounted on the board may be one or two or more, and the number, the kind, the arrangement, the pitch and the like of the devices are determined depending on the application, function or the like of the board.

Basically, the mounting structure may have any application or function; however, the mounting structure is used in, for example, an LED display, an LED backlight, an LED lighting system, an EL display, an electronic device or the like.

In addition to the above descriptions, the descriptions related to the first, second and third embodiments also apply to the fifth embodiment as long as they do not contradict the nature of the fifth embodiment.

According to a sixth embodiment, there is provided a mounting method including: mounting at least one device on a board including at least one bump, the device including at least one projection having a structure in which the surface of a projecting section made of an elastic body is coated with a conductive film, wherein at least a tip part of the projection is buried in the bump by applying pressure to either the board or the device toward the other.

Typically, at least a tip part of the projection is buried in the bump by applying pressure to either the board or the device toward the other in a state in which at least either the board or the device is coated with an adhesive in advance. At this time, it is preferable that while the projecting section made of an elastic body in the projection is elastically deformed, at least a tip part of the projection is buried in the bump. After that, in a state in which the pressure remains applied in such a manner, the adhesive is cured, thereby the state can be maintained.

In addition to the above descriptions, the descriptions related to the first, second, third and fifth embodiments also apply to the sixth embodiment as long as they do not contradict the nature of the sixth embodiment.

According to a seventh embodiment, there is provided a mounting structure including at least one device being mounted on a board including at least one projection, the device including at least one bump, the projection having a structure in which the surface of at least a tip part of a projecting section made of an elastic body is coated with a conductive film, wherein at least a tip part of the projection is buried in the bump.

The descriptions related to the first, second, third, fifth and sixth embodiments also apply to the seventh embodiment as long as they do not contradict the nature of the seventh embodiment.

According to an eighth embodiment, there is provided a mounting method including: mounting at least one device including at least one bump on a board including at least one projection, the projection having a structure in which the surface of at least a tip part of a projecting section made of an elastic body, wherein at least a tip part of the projection is buried in the bump by applying pressure to either the board or the device toward the other.

The descriptions related to the first, second, third, fifth and sixth embodiments also apply to the eighth embodiment as long as they do not contradict the nature of the eighth embodiment.

According to a ninth embodiment, there is provided an LED display comprising a plurality of red LEDs, a plurality of green LEDs, and a plurality of blue LEDs being mounted on a board, wherein at least one of the red LEDs, the green LEDs and the blue LEDs includes at least one projection on at least one electrode, the projection having a structure in which the surface of at least a tip part of a projecting section made of an elastic body is coated with a conductive film, the board includes at least one bump, and at least a tip part of the projection is buried in the bump.

In the ninth embodiment, as the red LEDs, the green LEDs and the blue LEDs, LEDs using a nitride-based Group III-V compound semiconductor can be used. As the red LEDs, for example, LEDs using a AlGaInP-based semiconductor can be used.

In addition to the above description, the descriptions related to the first, second, third, fifth and sixth embodiments also apply to the ninth embodiment as long as they do not contradict the nature of the ninth embodiment.

According to a tenth embodiment, there is provided an LED display comprising a plurality of red LEDs, a plurality of green LEDs, and a plurality of blue LEDs being mounted on a board, wherein at least one of the red LEDs, the green LEDs and the blue LEDs includes at least one bump on at least one electrode, the board includes at least one projection having a structure in which the surface of at least a tip part of a projecting section made of an elastic body is coated with a conductive film, and at least a tip part of the projection is buried in the bump.

In addition to the above descriptions, the descriptions related to the first, second, third, fifth, sixth and ninth embodiments also apply to the tenth embodiment as long as they do not contradict the nature of the tenth embodiment.

According to an eleventh embodiment, there is provided an LED backlight comprising a plurality of red LEDs, a plurality of green LEDs, and a plurality of blue LEDs being mounted on a board, wherein at least one of the red LEDs, the green LEDs and the blue LEDs includes at least one projection on at least one electrode, the projection having a structure in which the surface of at least a tip part of a projecting section made of an elastic body is coated with a conductive film, the board includes at least one bump, and at least a tip part of the projection is buried in the bump.

In addition to the above descriptions, the descriptions related to the first, second, third, fifth, sixth and ninth embodiments also apply to the eleventh embodiment as long as they do not contradict the nature of the eleventh embodiment.

According to a twelfth embodiment, there is provided an LED backlight comprising a plurality of red LEDs, a plurality of green LEDs, and a plurality of blue LEDs being mounted on a board, wherein at least one of the red LEDs, the green LEDs and the blue LEDs includes at least one bump on at least one electrode, the board includes at least one projection having a structure in which the surface of at least a tip part of a projecting section made of an elastic body is coated with a conductive film, and at least a tip part of the projection is buried in the bump.

In addition to the above descriptions, the descriptions related to the first, second, third, fifth, sixth and ninth embodiments also apply to the twelfth embodiment as long as they do not contradict the nature of the twelfth embodiment.

According to a thirteenth embodiment, there is provided an electronic device including one or a plurality of devices on a board, wherein at least one of the devices includes at least one projection having a structure in which the surface of at least a tip part of a projecting section made of an elastic body is coated with a conductive film, the board includes at least one bump, and at least a tip part of the projection is buried in the bump.

Basically, the electronic device may be any electronic device, and includes both of a portable type and a stationary type, and specific examples of the electronic device include a cellular phone, a mobile device, a robot, a personal computer, an in-vehicle device, various home appliances and the like.

In addition to the above descriptions, the descriptions related to the first, second, third, fifth, sixth and ninth embodiments also apply to the thirteenth embodiment as long as they do not contradict the nature of the thirteenth embodiment.

According to a fourteenth embodiment, there is provided an electronic device including one or a plurality of devices on a board, wherein at least one of the devices includes at least one bump, the board includes at least one projection having a structure in which the surface of at least a tip part of a projecting section made of an elastic body is coated with a conductive film, and at least a tip part of the projection is buried in the bump.

In addition to the above descriptions, the descriptions related to the first, second, third, fifth, sixth, ninth and thirteenth embodiments also apply to the fourteenth embodiment as long as they do not contradict the nature of the fourteenth embodiment.

In the above-described embodiments n, either the device or the board includes at least one projection having a structure in which the surface of at least a tip part of the projecting section made of the elastic body is coated with the conductive film, so in the case where the device is mounted on the board, when at least a tip part of the projection is buried in the bump by applying pressure either the board or the device toward the other, the projection is compressed by a compression force, thereby the projecting section made of the elastic body is elastically deformed so that the repulsion is applied to the bump. In this state, the conductive film of the projection constantly presses the bump. When the board and the device are bonded and fixed together in this state, the state in which the conductive film of the projection presses the bump is maintained. In this state, the device and the wiring on the board are securely electrically connected to each other, so connection reliability is high. Even if the pitch between bumps are reduced to 30 μm or less or 20 μm or less, the connection reliability is not changed, so the embodiments increase the number of pins. Moreover, for example, in the case where a plurality of bumps are formed on the board, even if variations in the heights of the bumps occur, the projection has elasticity, so compensation for variations in the height of the bumps can be provided. Further, in the case where a plurality of devices are mounted on the board, the parallelism between the devices and the board can be increased.

According to the embodiments, in the case where the device is mounted on the board, the wiring on the board and the device can be securely electrically connected to each other, and a finer bump can be formed, and a multi-pin connection is possible. Further, a high-performance LED display, an LED backlight, an LED lighting system, various electronic devices and the like can be achieved.

Additional features and advantages are described herein, and will be apparent from, the following Detailed Description and the figures.

BRIEF DESCRIPTION OF THE FIGURES

FIGS. 9A through 9G are photographs in lieu of drawings showing conditions of a compression bonded section between a projecting section and a bump at the time of bonding by varying a load applied in pressure bonding in the example of the mounting structure in which a device is mounted by the mounting method according to the first embodiment;

DETAILED DESCRIPTION

Embodiments are be described in detail below referring to the accompanying drawings. Throughout the drawings, like components are denoted by like numerals.

A first embodiment is described below.

Figure 1:
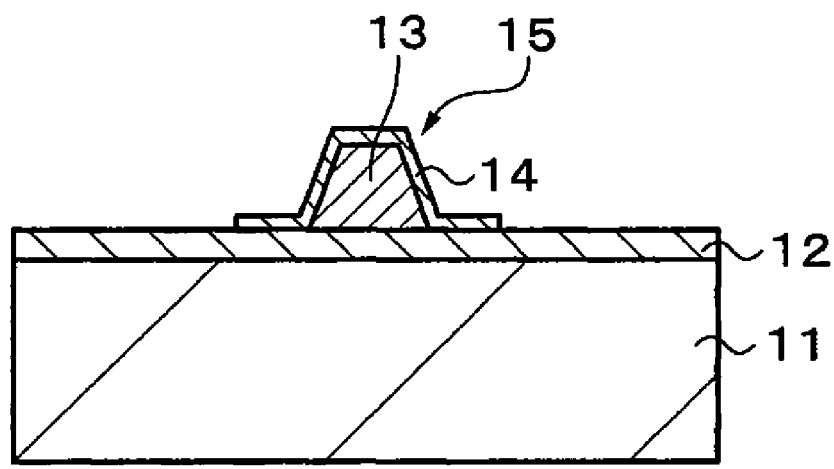
FIG. 1 is a sectional view showing a wiring board used in mounting in a first embodiment.

FIG. 1 shows a wiring board 10 used in the first embodiment.

As shown in FIG. 1, in the wiring board 10, wiring 12 with a predetermined pattern is formed on a board 11. A projection 15 including a projecting section 13 and a conductive film 14 laid over the surface of the projecting section 13 is formed on a predetermined part of the wiring 12. One or a plurality of projections 15 are formed, but in the drawing, only one projection 15 is shown. The projecting section 13 is made of an elastic body, and has, for example, the shape of a truncated cone or a truncated quadrangular pyramid. The conductive film 14 extends on the wiring 12, and is electrically connected to the wiring 12. The elastic body of which the projecting section 13 is made and the material and the thickness of the conductive film 14 are selected so that in the case where a device to be mounted on the wiring board 10 is pressure-bonded to the wiring board 10, at least a tip part of the projection 15 is buried in a bump on the device by a load applied at the time.

Figure 2:
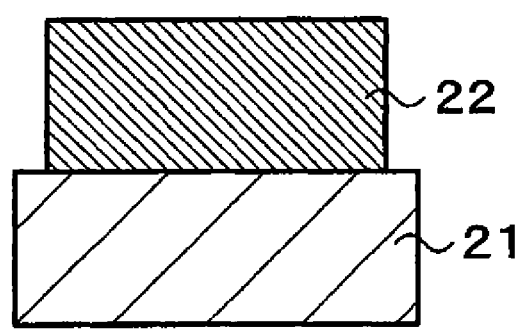
FIG. 2 is a sectional view showing a device mounted in the first embodiment.

FIG. 2 shows a device 20 mounted on the wiring board 10 in the first embodiment.

As shown in FIG. 2, in the device 20, a bump 22 is formed on an electrode (not shown) of a device body 21. The bump 22 is made of, but not limited to, Au, solder or the like.

Next, a method of mounting the device 20 on the wiring board 10 will be described below.

Figure 3A:
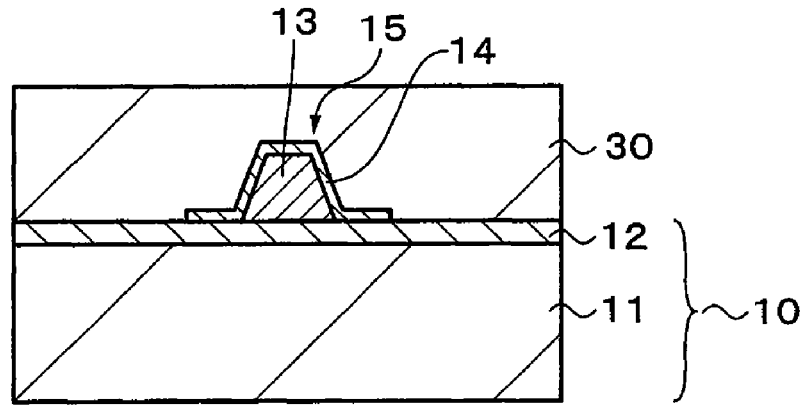
FIGS. 3A and 3B are sectional views for describing a mounting method according to a first embodiment.

At first, as shown in FIG. 3A, the wiring board 10 on which the projection 15 is formed is coated with an adhesive 30. The temperature for coating with the adhesive 30 is appropriately selected depending on the material of the adhesive 30, and the temperature may be a room temperature or any other temperature. In this case, as the adhesive 30, a thermosetting resin is used. The thickness of the adhesive 30 is larger than the height of the projection 15.

Figure 3B:
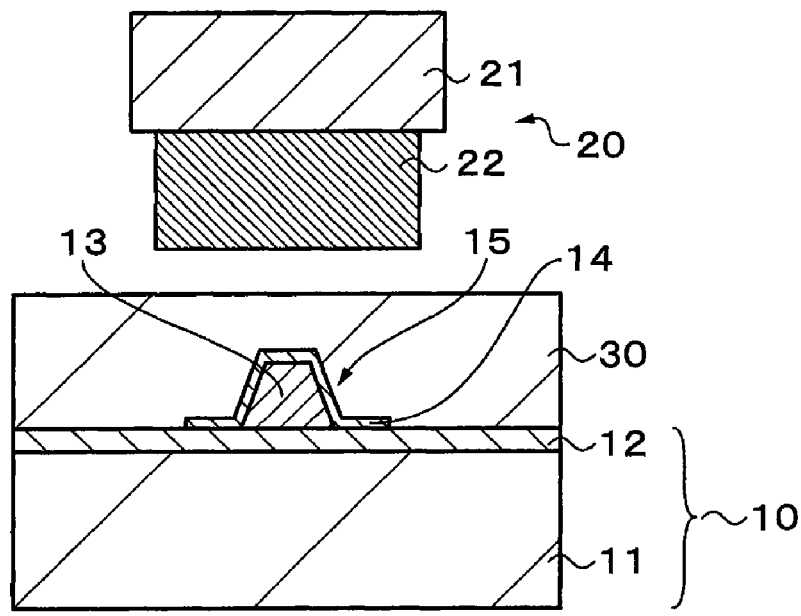

Next, in a state in which the adhesive 30 is not yet cured, as shown in FIG. 3B, while the device 20 and the wiring board 10 are kept in parallel to each other, the bump 22 of the device 20 is aligned with the projection 15 on the wiring board 10.

Figure 4A:
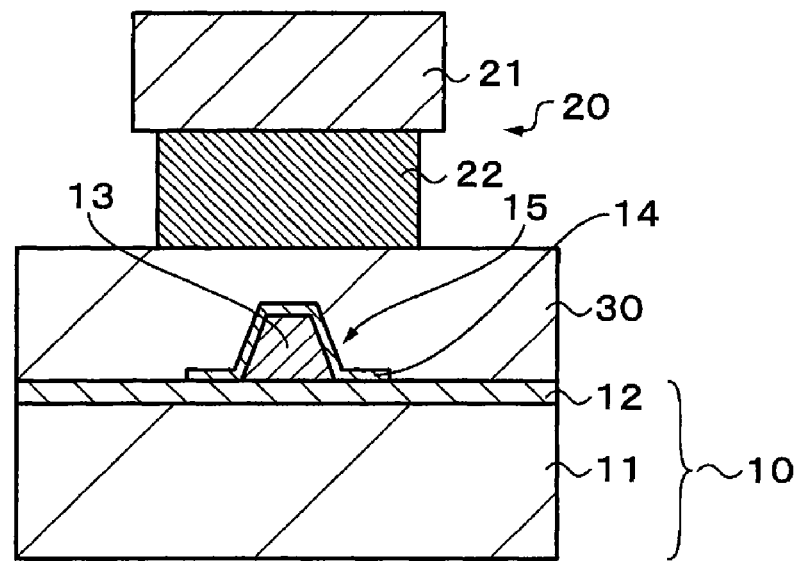
FIGS. 4A and 4B are sectional views for describing the mounting method according to the first embodiment.

Next, as shown in FIG. 4A, the device 20 is moved toward the wiring board 10 to make contact with the adhesive 30 which is not yet cured, and the device 20 is temporarily mounted through the use of the adhesion of the adhesive 30. The temperature at the time of temporarily mounting the device 20 is appropriately selected depending on the material of the adhesive 30, and the temperature may be a room temperature or any other temperature. One or a plurality of devices 20 are mounted on the wiring board 10, but only one device 20 is shown in the drawing.

Figure 4B:
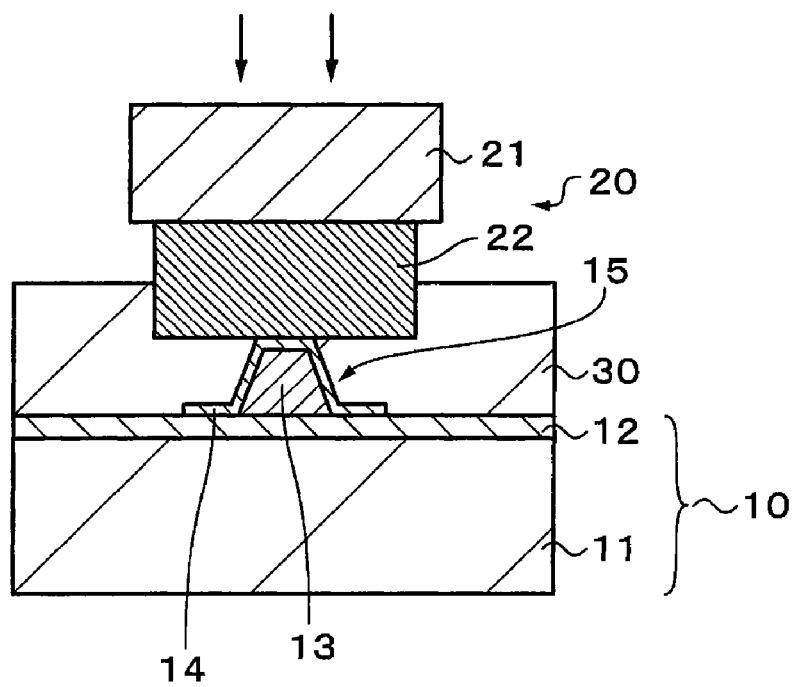

Next, as shown in FIG. 4B, pressure is applied to the device 20 from a surface opposite to a surface where the bump 22 is formed toward the wiring board 10, thereby the bump 22 is contacted with a tip part of the projection 15. To prevent damage to the device 20, it is desirable to apply pressure, for example, via silicone rubber with a thickness of 5 μm or the like. Moreover, the temperature at the time of applying pressure may be a room temperature or any other temperature.

Figure 5A:
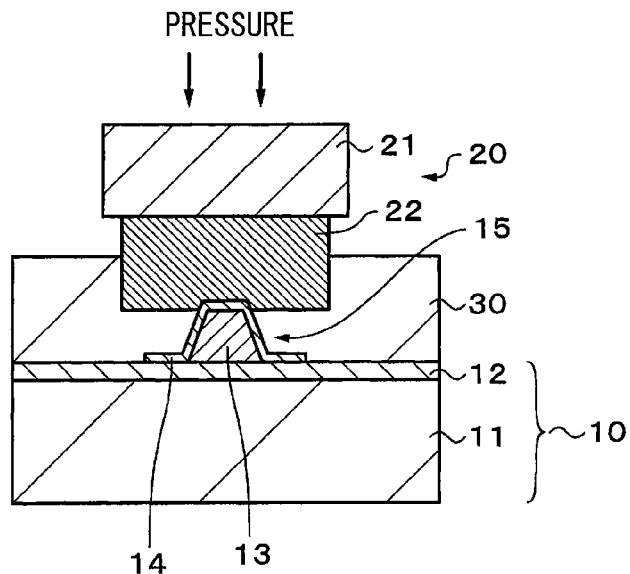
FIGS. 5A and 5B are sectional views for describing the mounting method according to the first embodiment.
Figure 5B:
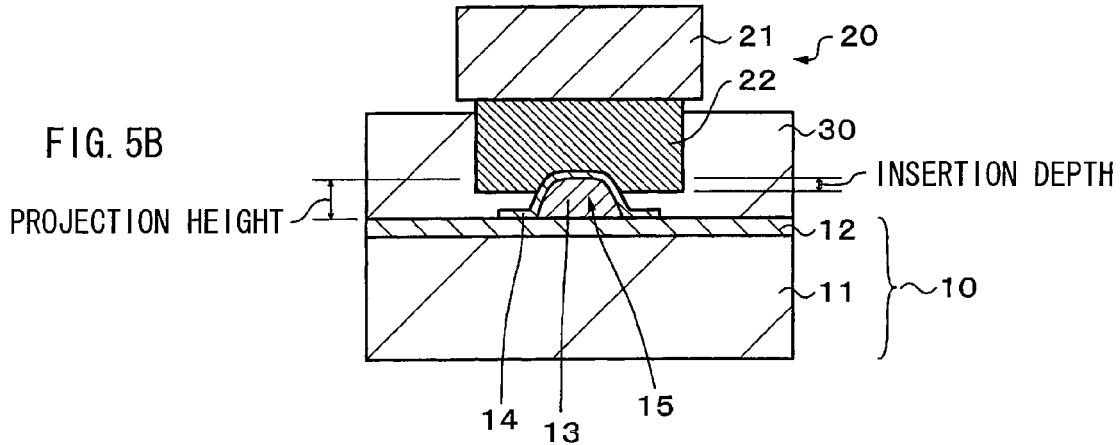

Next, as shown in FIG. 5A, when pressure is further applied to the device 20, the tip part of the projection 15 starts being buried in the bump 22, and finally the projection 15 is brought into a state shown in FIG. 5B. Thus, in a state in which the tip part of the projection 15 is buried in the bump 22, the projecting section 13 made of the elastic body in the projection 15 is elastically deformed by compression, so by the repulsion of the projecting section 13, the conductive film 14 of the projection 15 constantly presses the bump 22. Therefore, in this state, the conductive film 14 of the projection 15 is securely electrically connected to the bump 22.

Next, the adhesive 30 is cured by applying heat in the state. As a result, the device 20 and the wiring board 10 are bonded and fixed together by the adhesive 30, and the state in which the conductive film 14 of the projection 15 is securely electrically connected to the bump 22 is maintained.

As described above, a mounting structure in which the device 20 is mounted on the wiring board 10 in the state in which the wiring 12 on the wiring board 10 and the bump 22 of the device 20 are securely electrically connected to each other can be obtained.

Figure 6:
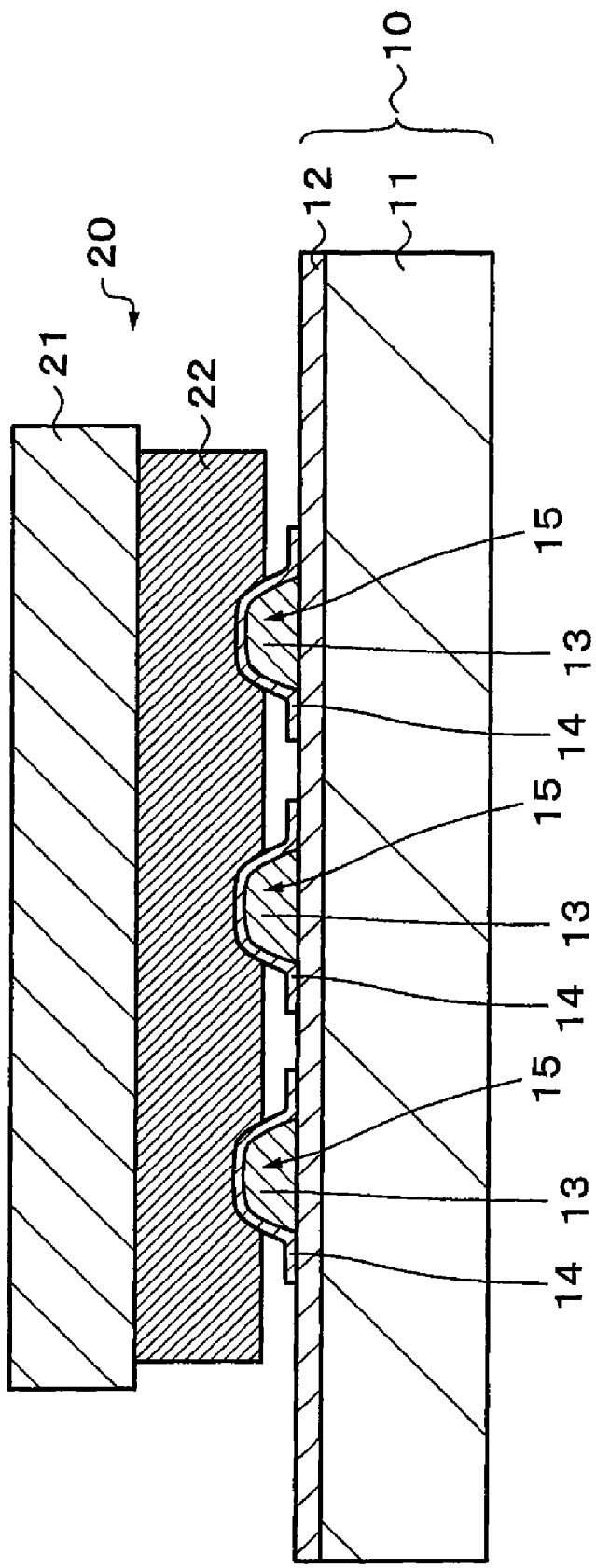
FIG. 6 is a sectional view showing another example of a mounting structure in which a device is mounted by the mounting method according to the first embodiment.

FIG. 6 shows an example of a mounting structure in which three projections 15 are connected to one bump 22.

EXAMPLES

As the device 20, a device in which 820 Au bumps as the bumps 22 were formed on a silicon chip (as the device body 21) with a pitch of 50 μm was used. Each Au bump had a size of 30 μm×85 μm, a height (a thickness) of 15±3 μm, and a vickers hardness $H_V$ of 50 or more.

Figure 7C:
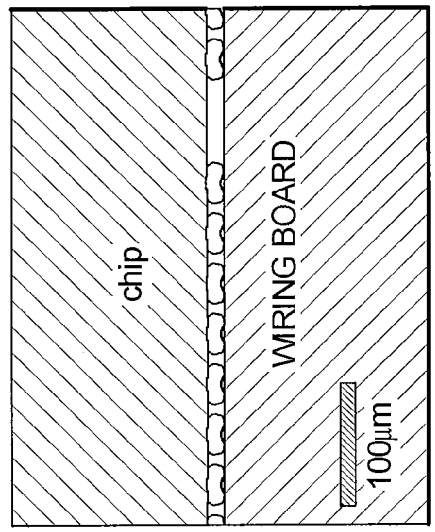
FIGS. 7A, 7B and 7C are photographs in lieu of drawings for describing an example of the mounting structure in which a device is mounted by the mounting method according to the first embodiment.
Figure 7B:
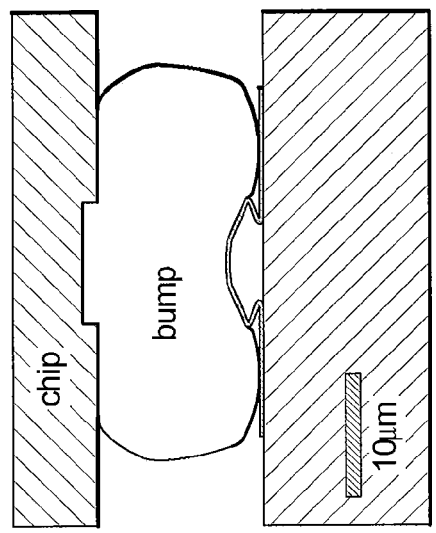
Figure 7A:
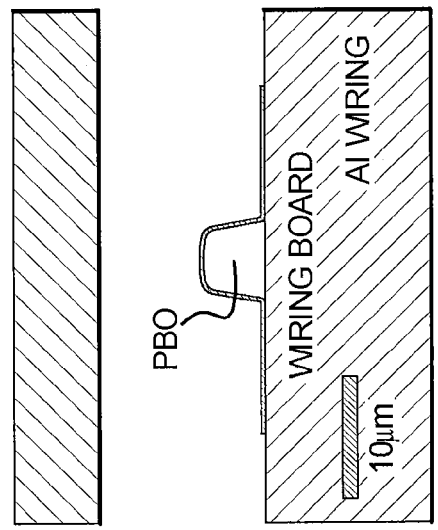

As the wiring 12, Al wiring made of an Al film with a thickness of 200 nm was formed on the board 11, and on the wiring 12, the projection 15 was formed. An electron microscope photograph showing this state is shown in FIG. 7A. The projecting section 13 of the projection 15 was formed by forming a PBO film on the board 11, and then performing patterning of the PBO film by photolithography and etching. The projecting section 13 had a diameter of 6 μm, and a height of 5.1 μm. The conductive film 14 was formed by forming a Ti film with a thickness of 10 nm and a Au film with a thickness of 200 μm in order by sputtering, and then performing patterning of the Ti/Au film by photolithography and etching.

Next, the wiring board 10 on which the projection 15 was formed was coated with a non-conductive paste (NCP) with a thickness of 25 μm as the adhesive 30.

Next, the device 20 was pressure-bonded to the wiring board 10, and at least a tip part of the projection 15 was buried in the Au bump. An electron microscope photograph showing this state is shown in FIG. 7B. The load applied in the application of pressure was 0.55 to 3.3 gf per projection 15 (per dot). The average number of projections 15 per Au bump was 5.6 (dots).

After that, the NCF as the adhesive 30 was cured by heating at 190° C. for 10 seconds.

Thus, the device 20 was mounted on the wiring board 10. An electron microscope photograph showing this state is shown in FIG. 7C.

Figure 8:
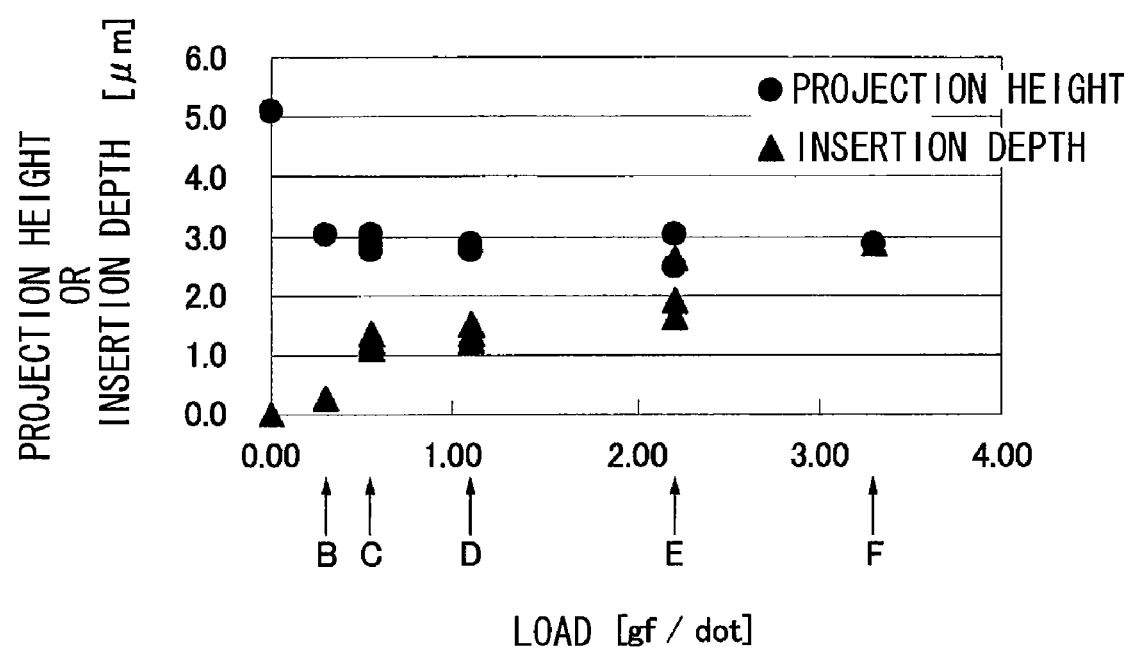
FIG. 8 is a schematic view showing results of measuring the relationship between a load applied to each projecting section at the time of pressure bonding and the height of the projecting section after bonding and the insertion depth of the projecting section into a bump in the example of the mounting structure in which a device is mounted by the mounting method according to the first embodiment.
Figures 10A, 10B, 10C, 10D, 10E:
FIGS. 10A through 10E are schematic views showing measurement results of connection resistance of the compression bonded section between the projecting section and the bump at the time of bonding by varying a load applied in pressure bonding in the example of the mounting structure in which a device is mounted by the mounting method according to the first embodiment.

FIG. 8 shows results of measuring the relationship between the load applied per dot in pressure bonding and the height (projection height) of the projection 15 and the insertion depth of the projection 15 into the bump 22 in the bonding state (regarding the projection height and the insertion depth, refer to FIG. 5B). As shown in FIG. 8, the height of the projecting section 13 of the projection 15 was 5.1 μm at first, and there was a tendency that the deformation of the projection 15 stopped when the height reached 2.8 μm; however, there was a tendency that the insertion depth into the bump 22 was increased with an increase in the load. FIGS. 9A through 9G show states in which when the load applied per dot was varied, the projection 15 was deformed by compression. FIG. 9A shows an electron microscope photograph showing a state before connection, and FIGS. 9B, 9C, 9D, 9E and 9F show electron microscope photographs of mounting structures obtaining data B, C, D, E and F in FIG. 8, respectively. From a comprehensive view, in this example, it could be considered that the load applied per dot in pressure bonding was preferably 1 to 3 gf. FIG. 9G shows a part in which the projection was not buried of the bump 22 for comparison.

FIGS. 10A, 10B, 10C, 10D and 10E show measurement results of connection resistance per bump 22 in the mounting structures obtaining the data B, C, D, E and F in FIGS. 9B through 9F, respectively. The bump 22 and the projection 15 were conducted at all measurement points, and the connection resistance at most of the measurement points was 0.12Ω or less.

As described above, in the first embodiment, the projection 15 with a structure in which the surface of the projecting section 13 made of the elastic body is coated with the conductive film 14 is formed on the wiring 12 of the wiring board 10, and the device 20 is temporarily mounted on the wiring board 10 in the state in which the wiring board 10 is coated with the adhesive 30, and pressure is applied to the device 20 toward the wiring board 10 so that at least a tip part of the projection 15 is buried in the bump 22 of the device 20, and then the adhesive 30 is cured, so the bump 22 and the projection 15 can be securely electrically connected to each other. Therefore, the device 20 and the wiring 12 of the wiring board 10 can be securely electrically connected to each other, and high connection reliability can be obtained. Moreover, in the case where a plurality of bumps 22 are formed on the wiring board 10, even if variations in the heights of the bumps 22 occur, the projecting section 13 made of the elastic body in the projection 15 is elastically deformed in a height direction, so compensation for the variations in height can be provided. Further, because of the same reason, compensation for the parallelism of the device 20 with the wiring board 10 can be provided, so high parallelism can be obtained.

Next, a second embodiment is described below.

Figure 11:
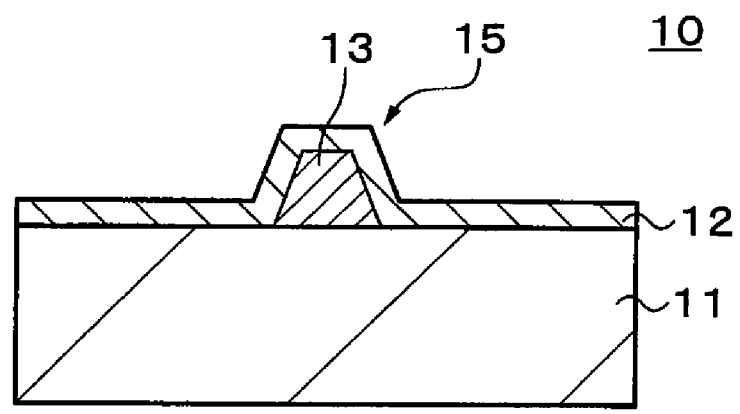
FIG. 11 is a sectional view showing a wiring board used in mounting according to a second embodiment.

FIG. 11 shows the wiring board 10 used in the second embodiment.

As shown in FIG. 11, in the second embodiment, the structure of the projection 15 on the wiring board 10 is different from that in the first embodiment. More specifically, in the wiring board 10, the projecting section 13 is formed between the board 11 and the wiring 12 in a predetermined part of the wiring 12. Then, the projection 15 includes the projecting section 13 and a conductive film constituting a part laid on the surface of the projecting section 13 of the wiring 12.

The structure of the device 20 and a method of mounting the device 20 on the wiring board 10 are the same as those in the first embodiment.

Figure 12:
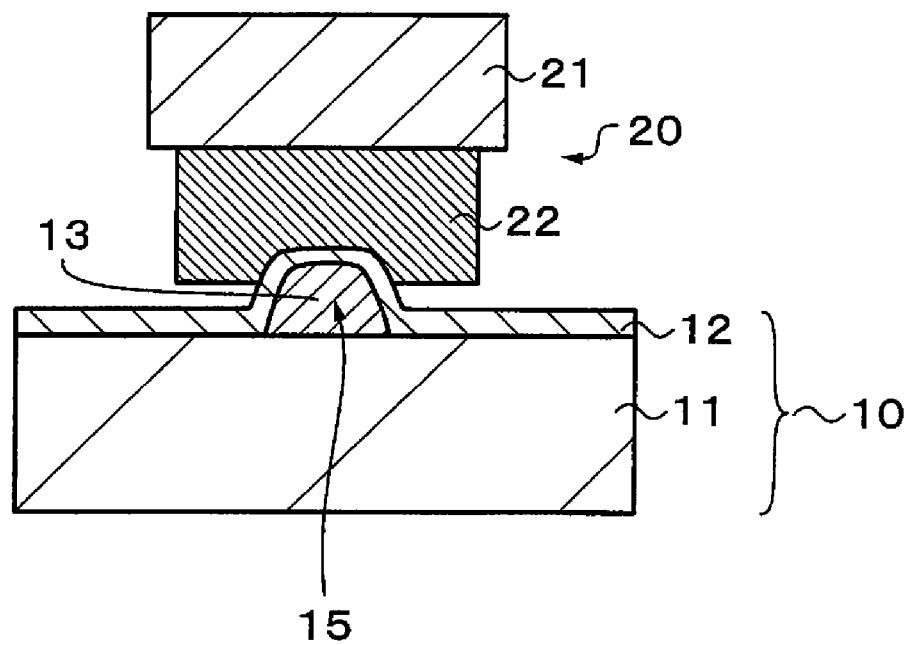
FIG. 12 is a sectional view showing an example of a mounting structure in which a device is mounted by a mounting method according to a second embodiment.

FIG. 12 shows a mounting structure in which the device 20 is mounted on the wiring board 10.

In the second embodiment, the same advantages as those in the first embodiment can be obtained.

Next, a third embodiment of the invention will be described below.

Figure 13:
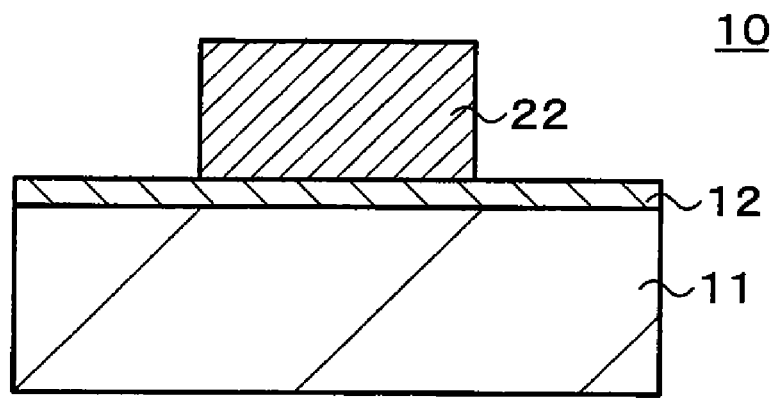
FIG. 13 is a sectional view showing a wiring board used in mounting according to a third embodiment.

FIG. 13 shows the wiring board 10 used in the third embodiment.

Figure 14:
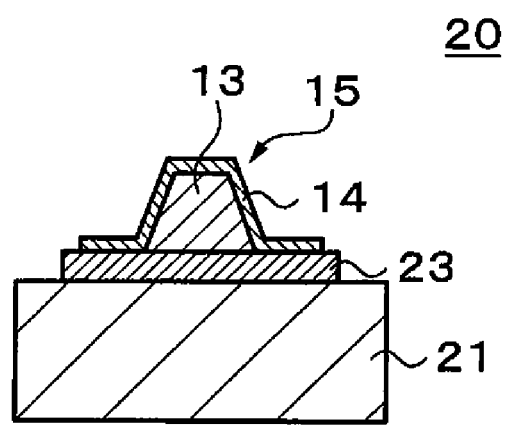
FIG. 14 is a sectional view showing a device mounted in a third embodiment.

As shown in FIG. 13, in the third embodiment, the bump 22 is formed on the wiring 12 of the wiring board 10. In this case, the projection 15 is not formed on the wiring board 10. Alternatively, as shown in FIG. 14, the projection 15 is formed on an electrode 23 of the device 20.

The method of mounting the device 20 on the wiring board 10 is the same as that in the first embodiment.

Figure 15:
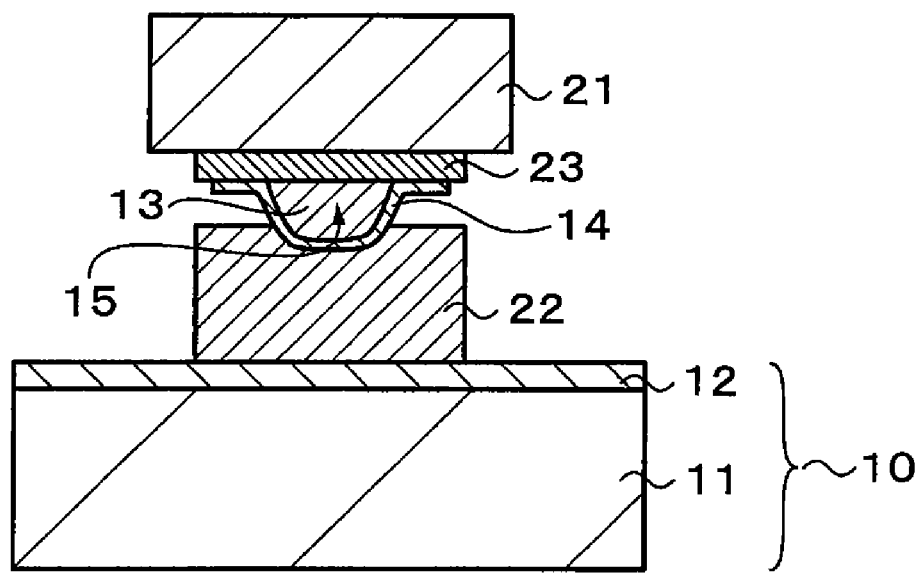
FIG. 15 is a sectional view showing a mounting structure in which a device is mounted by a mounting method according to a third embodiment.

FIG. 15 shows a mounting structure in which the device 20 is mounted on the wiring board 10.

In the third embodiment, the same effects as those in the first embodiment can be obtained.

Next, a fourth embodiment is described below. In the fourth embodiment, the device 20 is a micro-LED, and the case where the micro-LED is mounted on the wiring board 10 will be described below.

Figure 16:
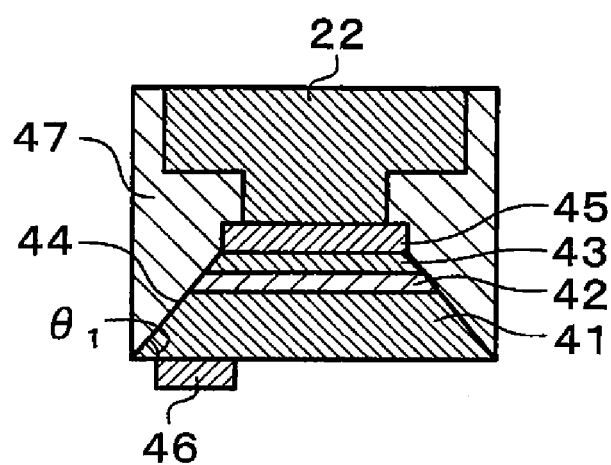
FIG. 16 is a sectional view showing a micro-LED mounted in a fourth embodiment.

FIG. 16 shows a micro-LED 40.

As shown in FIG. 16, in the micro-LED 40, an LED structure including an n-type semiconductor layer 41, an active layer 42 thereon and a p-type semiconductor layer 43 thereon is formed. The n-type semiconductor layer 41, the active layer 42 and the p-type semiconductor layer 43 have, for example, a circular planar shape as a whole, and an end surface (side surface) 44 is inclined at an angle $\theta_1$ with respect to a bottom surface of the n-type semiconductor layer 41. The sectional shapes of the n-type semiconductor layer 41, the active layer 42 and the p-type semiconductor layer 43 in a diameter direction are a trapezoidal shape ($\theta_1<90$ degrees), a rectangular shape ($\theta_1=90$ degrees) or an inverted trapezoidal shape ($\theta_1>90$ degrees), and on the p-type semiconductor layer 43, for example, a p-side electrode 45 with a circular shape is formed. The bump 22 is formed on the p-side electrode 45. For example, an n-side electrode 46 with a circular shape is formed on a part of the bottom surface of the n-type semiconductor layer 41. The peripheries of the end surface 44, the p-side electrode 45 and the bump 22 are sealed with a sealing compound 47 such as a resin.

The semiconductors used for the n-type semiconductor layer 41, the active layer 42 and the p-type semiconductor layer 43 are selected as necessary. More specifically, for example, a GaN-based semiconductor, a AlGaInP-based semiconductor or the like is used.

In the case where the micro-LED 40 is, for example, a GaN-based LED, specific examples of the dimensions, materials and the like of components of the GaN-based LED are as follows. The n-type semiconductor layer 41 is an n-type GaN layer with a thickness of, for example, 2600 nm, the active layer 42 has a thickness of, for example, 200 nm, and the p-type semiconductor layer 43 is a p-type GaN layer with a thickness of, for example, 200 nm. The active layer 42 has, for example, a multiple quantum well (MQW) structure including an InGaN well layer and a GaN barrier layer, and the In composition of the InGaN well layer is, for example, 0.17 in the case where the GaN-based LED emits blue light, and 0.25 in the case where the GaN-based LED emits green light. Providing that the maximum diameter of the LED structure, that is, the diameter of the bottom surface of the n-type semiconductor layer 41 is a, a is, for example, 20 μm. As described above, in the case where the thickness of a n-type GaN layer as the n-type semiconductor layer 41 is 2600 nm, and the thicknesses of the p-type GaN layers as the active layer 42 and the p-type semiconductor layer 43 are 200 nm, the whole thickness of the LED structure is 2600+200+200=3000 nm=3 μm. In this case, providing that the whole thickness (height) of the LED structure is b, the aspect ratio of the LED structure is b/a=3/20=0.15. $\theta_1$ is, for example, 50 degrees. The p-side electrode 45 includes, for example, a metal multilayer film with a Ag/Pt/Au structure, and the thickness of a Ag film is, for example, 50 nm, the thickness of a Pt film is, for example, 50 nm, and the thickness of a Au film is, for example, 2000 nm. The p-side electrode 45 may include a single-layer film of Ag. The n-side electrode 46 includes, for example, a metal multilayer with a Ti/Pt/Au structure, and the thicknesses of a Ti film and a Pt film are, for example, 50 nm, and the thickness of a Au film is, for example, 2000 nm.

The bump 22 is, for example, a circular Au bump, and has a diameter of, for example, 15 μm, a height (thickness) of, for example, 7 μm, and a vickers hardness $H_V$ of 60.

In the micro-LED 40, light emitted from the active layer 42 during operation is reflected by the end surface 44, and is extracted from the bottom surface of the n-type semiconductor layer 41 to outside, or the light directly goes to the bottom surface of the n-type semiconductor layer 41, and is extracted to outside.

The structure of the wiring board 10 and the method of mounting the micro-LED 40 on the wiring board 10 are the same as those in the first embodiment. The projecting section 13 of the projection 15 on the wiring board 10 has, for example, a diameter of 5 μm and a thickness (height) of 3 μm, and the compressive elastic modulus of the elastic body of which the projecting section 13 is made is, for example, 3 GPa, and the conductive film 14 is, for example, a Au film with a thickness of 0.1 μm.

Figure 17:
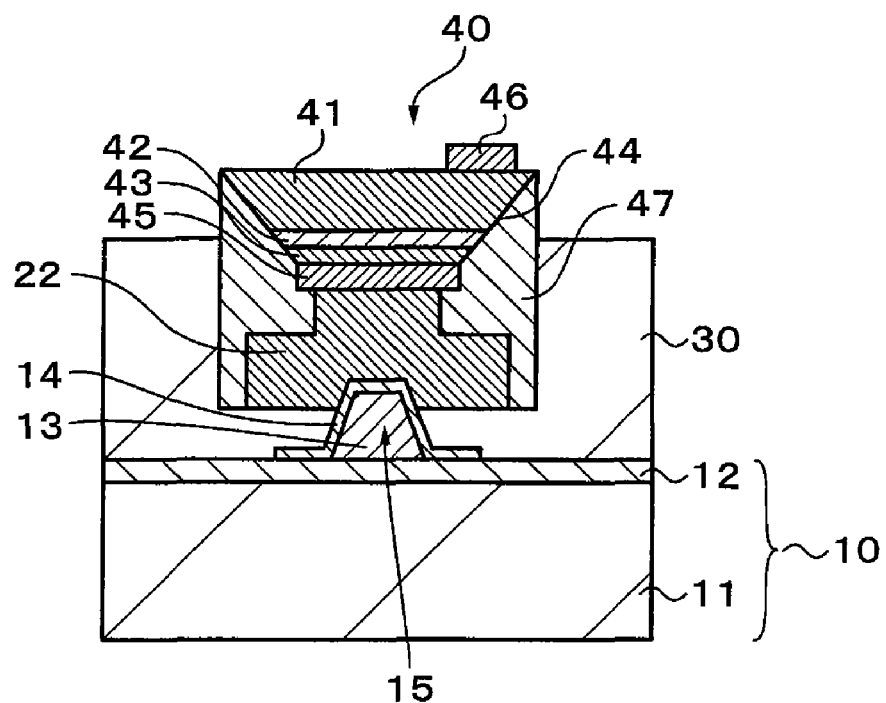
FIG. 17 is a sectional view showing a mounting structure in which a micro-LED is mounted by a mounting method according to a fourth embodiment.

FIG. 17 shows a mounting structure in which the micro-LED 40 is mounted on the wiring board 10.

In the fourth embodiment, in the case where the micro-LED 40 is mounted on the wiring board 10, the same effects as those in the first embodiment can be obtained.

Next, a fifth embodiment is described below.

Figure 18:
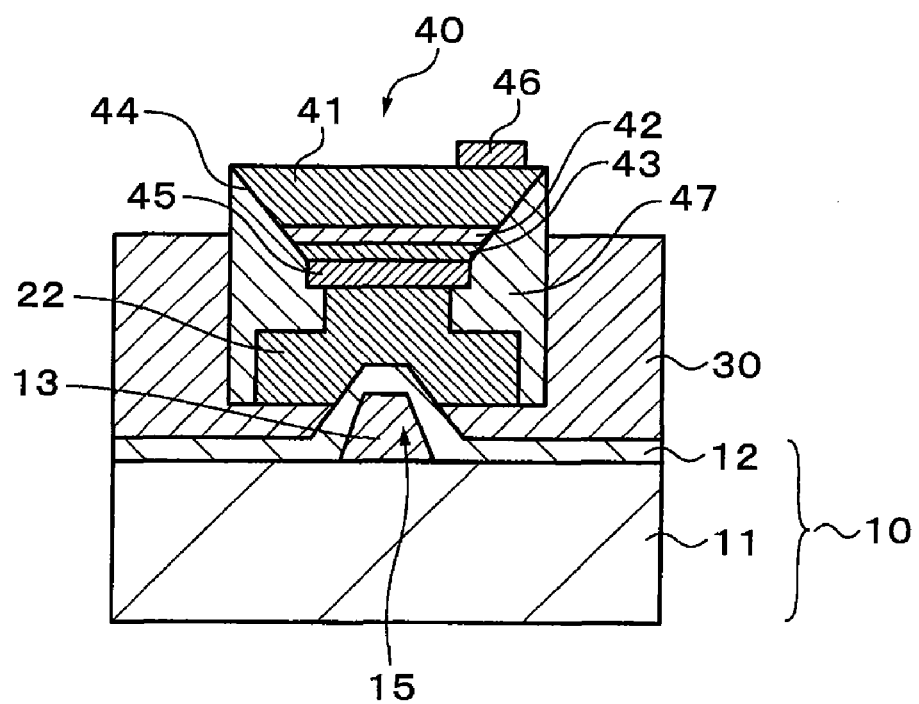
FIG. 18 is a sectional view showing a mounting structure in which a micro-LED is mounted by a mounting method according to a fifth embodiment.

As shown in FIG. 18, in the fifth embodiment, the micro-LED 40 in the fourth embodiment is mounted on the same wiring board 10 as that in the second embodiment.

The method of mounting the micro-LED 40 on the wiring board 10 is the same as that in the first embodiment.

In the fifth embodiment, in the case where the micro-LED 40 is mounted on the wiring board 10, the same advantages as those in the first embodiment can be obtained.

Next, a sixth embodiment is described below.

Figure 19:
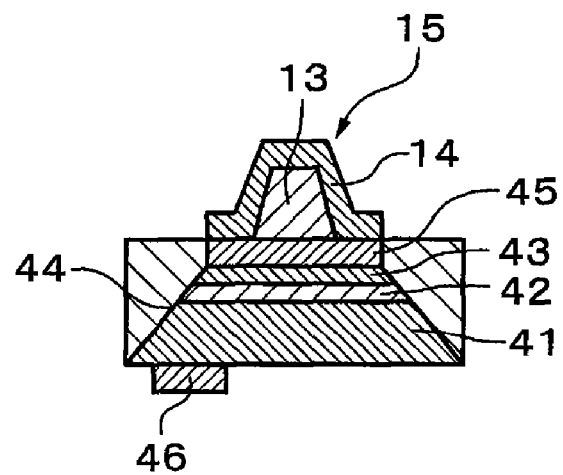
FIG. 19 is a sectional view showing a micro-LED mounted in a sixth embodiment.

In the sixth embodiment, the case where the micro-LED 40 shown in FIG. 19 is mounted on the wiring board 10 is described below.

As shown in FIG. 19, the micro-LED 40 has the same structure as the micro-LED in the fourth embodiment, except that the bump 22 is not formed on the p-side electrode 45, and instead of the bump 22, the projection 15 is formed.

The structure of the wiring board 10 is the same as that in the third embodiment, and the method of mounting the micro-LED 40 on the wiring board 10 is the same as that in the first embodiment.

Figure 20:
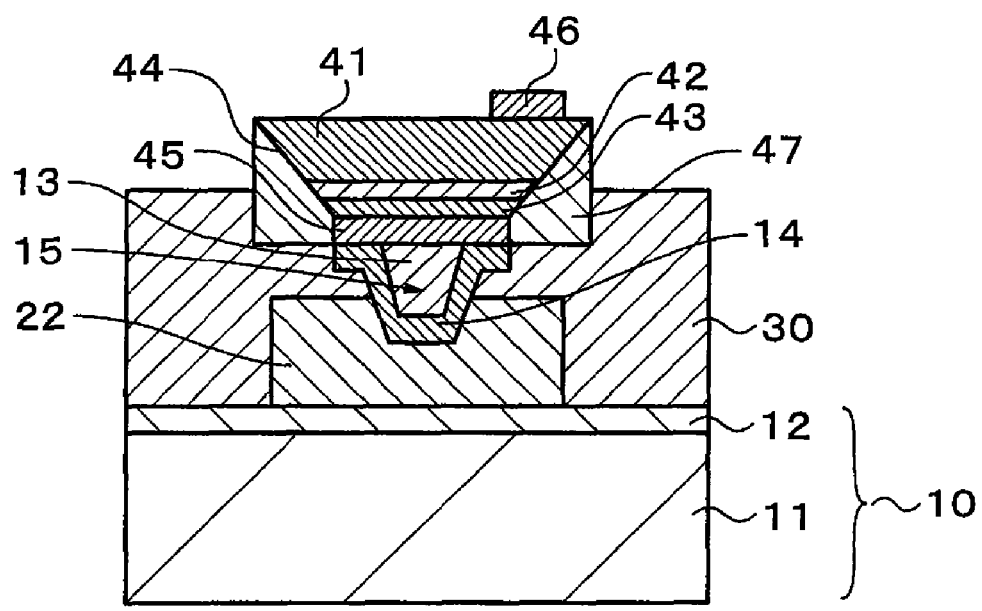
FIG. 20 is a sectional view showing a mounting structure in which a micro-LED is mounted by a mounting method according to a sixth embodiment.

FIG. 20 shows a mounting structure in which the micro-LED 40 is mounted on the wiring board 10.

In the sixth embodiment, in the case where the micro-LED 40 is mounted on the wiring board 10, the same advantages as those in the first embodiment can be obtained.

Next, a seventh embodiment is described below. In the seventh embodiment, a method of manufacturing a micro-LED display by mounting a red micro-LED, a green micro-LED and a blue micro-LED, all of which have the same structure as that of the micro-LED 40 shown in FIG. 16, on the wiring board 10 through the use of the mounting method in the fourth embodiment will be described below.

Three projections 15 per micro-LED are formed in all positions where micro-LEDs are mounted on the wiring 12 of the wiring board 10 as a display board.

At first, as in the case shown in FIG. 3A, the wiring board 10 on which the projections 15 are formed is coated with the adhesive 30. As the adhesive 30, for example, a thermoset epoxy resin is used, and the thickness of the adhesive 30 is, for example, 5 μm.

Next, in a state in which the adhesive 30 is not yet cured, as in the case shown in FIG. 4A, at first, 160×120 red micro-LEDs 40R are temporarily mounted in parallel in a predetermined region on the wiring board 10 through the use of adhesion of the adhesive 30. Next, as in the case of the red micro-LEDs 40R, another 160×120 red micro-LEDs 40R are temporarily mounted in parallel in the next region on the wiring board 10. This process is repeated, thereby 640×480 red micro-LEDs 40R are temporarily mounted in total. Next, by the same method, green micro-LEDs 40G and blue micro-LEDs 40B are temporarily mounted with a nested structure, thereby a micro-LED array including 640×480 red micro-LEDs 40R, 640×480 green micro-LEDs 40G and 640×480 blue micro-LEDs 40B is formed.

Next, as in the case shown in FIG. 4B, pressure is applied to the micro-LED array toward the wiring board 10 on which the micro-LED array is temporarily mounted from a surface opposite to a surface where the bumps 22 are formed, thereby the bumps 22 are contacted to the tip parts of the projections 15. To prevent damage to the micro-LED array, pressure is applied, for example, via silicone rubber with a thickness of approximately 5 μm.

Next, as in the case shown in FIG. 5A, the tip parts of the projections 15 are buried in the bumps 22 by applying pressure to the micro-LED array, and finally the projections 15 are brought into the same state shown in FIG. 5B. Thus, in the state in which the tip parts of the projections 15 are buried in the bumps 22, the projecting sections 13 made of the elastic body in the projections 15 are compressed to be elastically deformed, so the conductive films 14 of the projections 15 constantly press the bumps 22 by repulsion of the projecting sections 13. In this state, the conductive films 14 of the projections 15 are securely electrically connected to the bumps 22. The load applied in the application of pressure is, for example, 3 gf per bump 22, and 2.8 t (tons) in total.

Next, the adhesive 30 is cured by heating in this state. As a result, the state in which the conductive films 14 of the projections 15 are securely electrically connected to the bumps 22 is maintained.

Thus, a mounting structure in which the micro-LEDs 40R, 40G and 40B are mounted on the wiring board 10 in the state in which the bumps 22 and the wiring 12 on the wiring board 10 are securely electrically connected to each other can be obtained.

Figure 21:
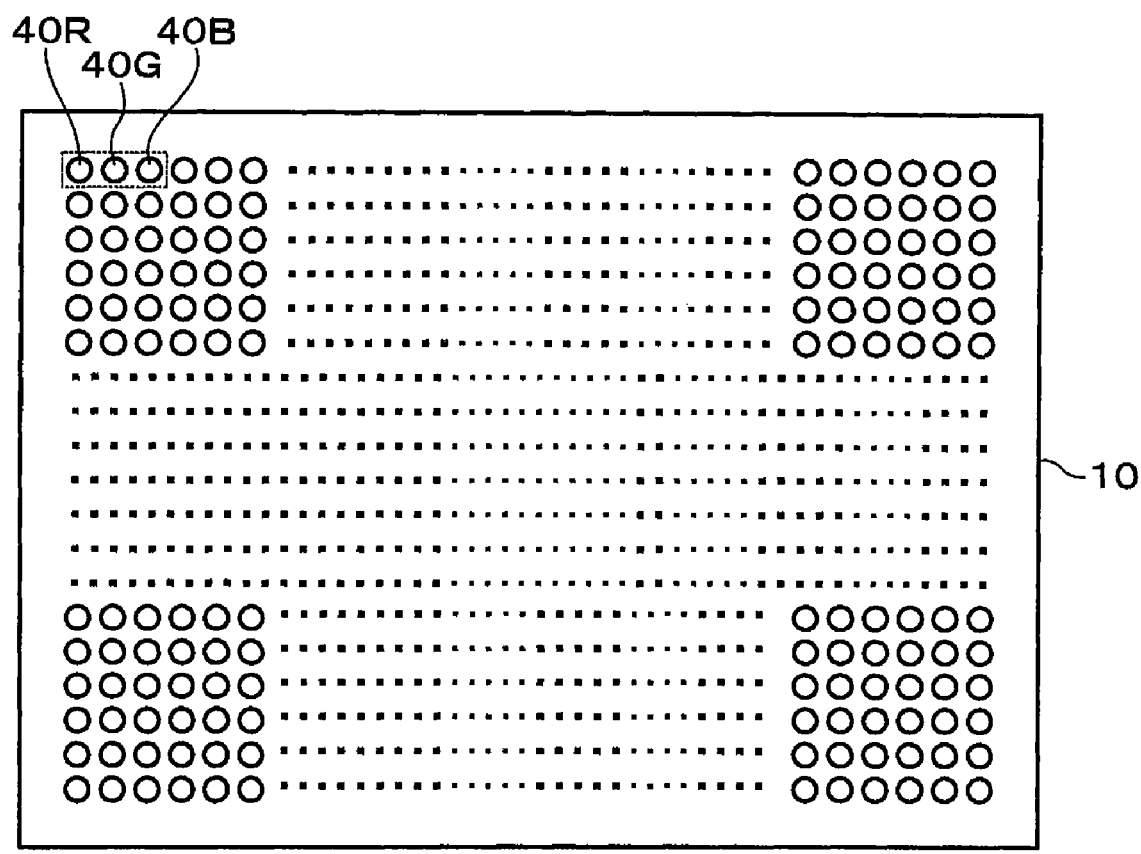
FIG. 21 is a schematic view showing a micro-LED display in which a micro-LED is mounted by a mounting method according to a seventh embodiment.

After that, predetermined wiring is installed on the n-side electrodes 46 of the micro-LEDs 40R, 40G and 40B, and as shown in FIG. 21, the micro-LED display is manufactured.

As described above, in the seventh embodiment, the wiring 12 on the wiring board 10 and the micro-LEDs 40R, 40G and 40B can be securely electrically connected to each other by using the connection between the projections 15 on the wiring board 10 and the bumps 22 of the micro-LEDs 40R, 40G and 40B, and a high-reliable 640×480-pixel full-color micro-LED display can be easily achieved. Moreover, the micro-LEDs 40R, 40G and 40B can be connected to the wiring board 10 with a narrow pitch of approximately 20 μm or less; therefore, for example, a 5-inch full-HD (High Definition) high-resolution full color micro-LED display can be achieved.

Next, an eighth embodiment is described below.

Figure 22:
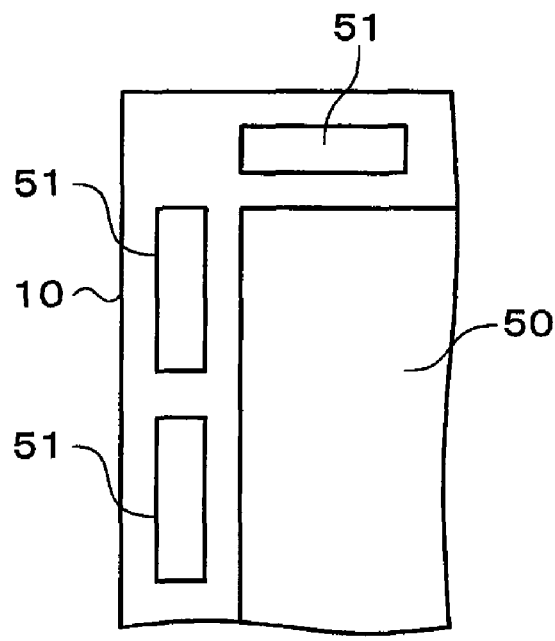
FIG. 22 is a schematic view showing a liquid crystal display in which a pixel-driving IC chip is mounted by a mounting method according to a eighth embodiment.

In the eighth embodiment, as shown in FIG. 22, a pixel-driving IC chip 51 is mounted in a pixel region of the wiring board 10 as the display board of a liquid crystal display, that is, a region outside a liquid crystal display section 50 through the use of a COG (Chip On glass) technique. The pixel-driving IC chip 51 has, for example, a bump pitch of 15 μm, 2000 pins, and a chip size of 2 mm×20 mm.

More specifically, for example, after the liquid crystal display section 50 is formed on the wiring board 10 using a glass board as the board 11 by a heretofore known method, the projection 15 is formed in a position corresponding to the bump 22 of the pixel-driving IC chip 51 on a part where the pixel-driving chip 51 is mounted of the wiring 12 of the wiring board 10.

Next, as in the case shown in FIG. 3A, the wiring board 10 on which the projection 15 is formed is coated with the adhesive 30. As the adhesive 30, for example, a NCP, a thermoset epoxy resin or the like is used.

Next, in the state in which the adhesive 30 is not yet cured, as in the case shown in FIG. 4A, a necessary number of pixel-driving IC chips 51 are temporarily mounted in a predetermined region on the wiring board 10 through the use of adhesion of the adhesive 30.

Next, as in the case shown in FIG. 4B, pressure is applied to the pixel-driving IC chips 51 toward the wiring board 10 on which the pixel-driving IC chips 51 are temporarily mounted in such a manner from a surface opposite to a surface where the bumps 22 are formed, thereby the bumps 22 are contacted to tip parts of the projections 15. To prevent damage to the pixel-driving IC chips 51, pressure is applied via an elastic body sheet such as silicone rubber.

Next, as in the case shown in FIG. 5A, pressure is further applied to the pixel-driving IC chips 51 to bury the tip parts of the projections 15 in the bumps 22, and finally the projections 15 are brought into the same state shown in FIG. 5B. Thus, in the state in which the tip parts of the projections 15 are buried in the bumps 22, the projecting sections 13 made of the elastic body of the projections 15 are compressed to be elastically deformed, so the conductive films 14 of the projections 15 constantly press the bumps 22 by repulsion of the projecting sections 13. Therefore, in this state, the conductive films 14 of the projections 15 are securely electrically connected to the bumps 22. The load applied in the application of pressure is, for example, 3 gf per bump 22.

Next, the adhesive 30 is cured by heating in this state. As a result, the state in which the conductive films 14 of the projections 15 are securely electrically connected to the bumps 22 is maintained.

Thus, a liquid crystal display in which the pixel-driving IC chips 51 are mounted on the region outside the liquid crystal display section 50 on the wiring board 10 by the COG technique in the state in which the bumps 22 and the wiring 12 of the wiring board 10 are securely electrically connected to each other can be obtained.

As described above, in the eighth embodiment, the wiring 12 on the wiring board 10 and the pixel-driving IC chips 51 can be securely electrically connected to each other through the use of the connection between the projections 15 and the bumps 22, and a high-reliable liquid crystal display can be easily achieved. Moreover, even if the bumps 22 of the pixel-driving IC chips 51 are formed with a narrow pitch of 15 μm, connection is possible, so the chip size of the pixel-driving IC chip 51 can be reduced, and the cost of the pixel-driving IC chip 51 can be reduced. Therefore, for example, a 5-inch full-HD high-resolution full-color liquid crystal display can be achieved.

Although the embodiments are described in detail, they are not limited to the above-described embodiments, and can be modified on the basis of the technical idea thereof.

For example, values, materials, structures, shapes, boards, raw materials, processes and so on in the first to eighth embodiments are merely examples, and different values, materials, structures, shapes, boards, raw materials, processes and so on may be used as necessary.

Figure 23:
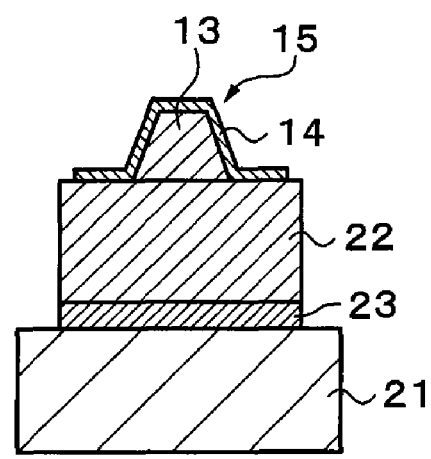
FIG. 23 is a sectional view showing a device mounted in another embodiment.
Figure 24:
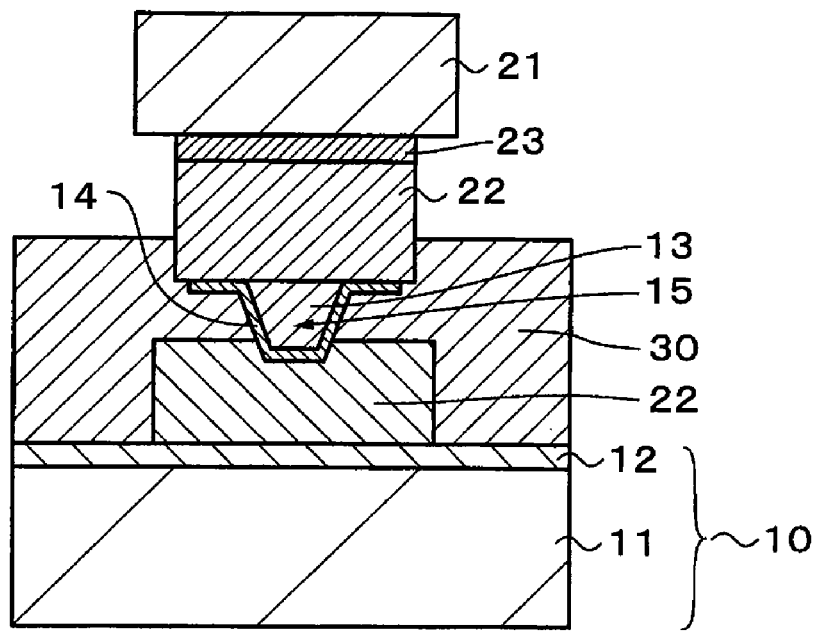
FIG. 24 is a sectional view showing a mounting structure in which a device is mounted by a mounting method according to another embodiment.

Moreover, for example, as shown in FIG. 23, as the device 20, a device in which the bump 22 is formed on the electrode 23 of the device body 21, and the projection 15 is formed on the bump 22 may be used. FIG. 24 shows a mounting structure in which the device 20 is mounted on the wiring board 10 by pressure bonding. The device 20 and the wiring board 10 are bonded and fixed together by the adhesive 30.

Figure 25:
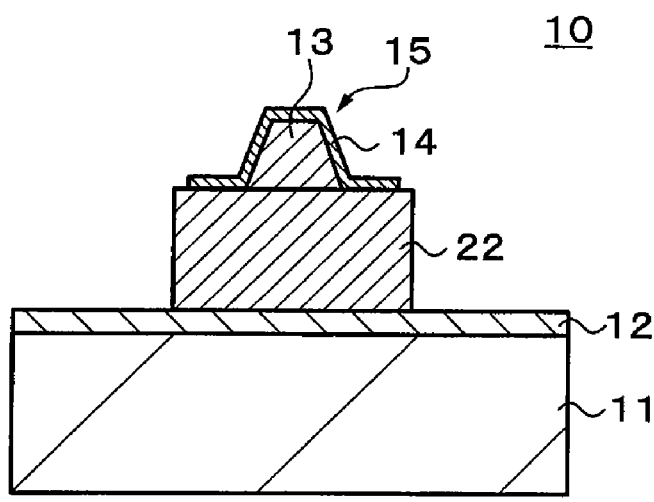
FIG. 25 is a sectional view showing a device mounted in still another embodiment.
Figure 26:
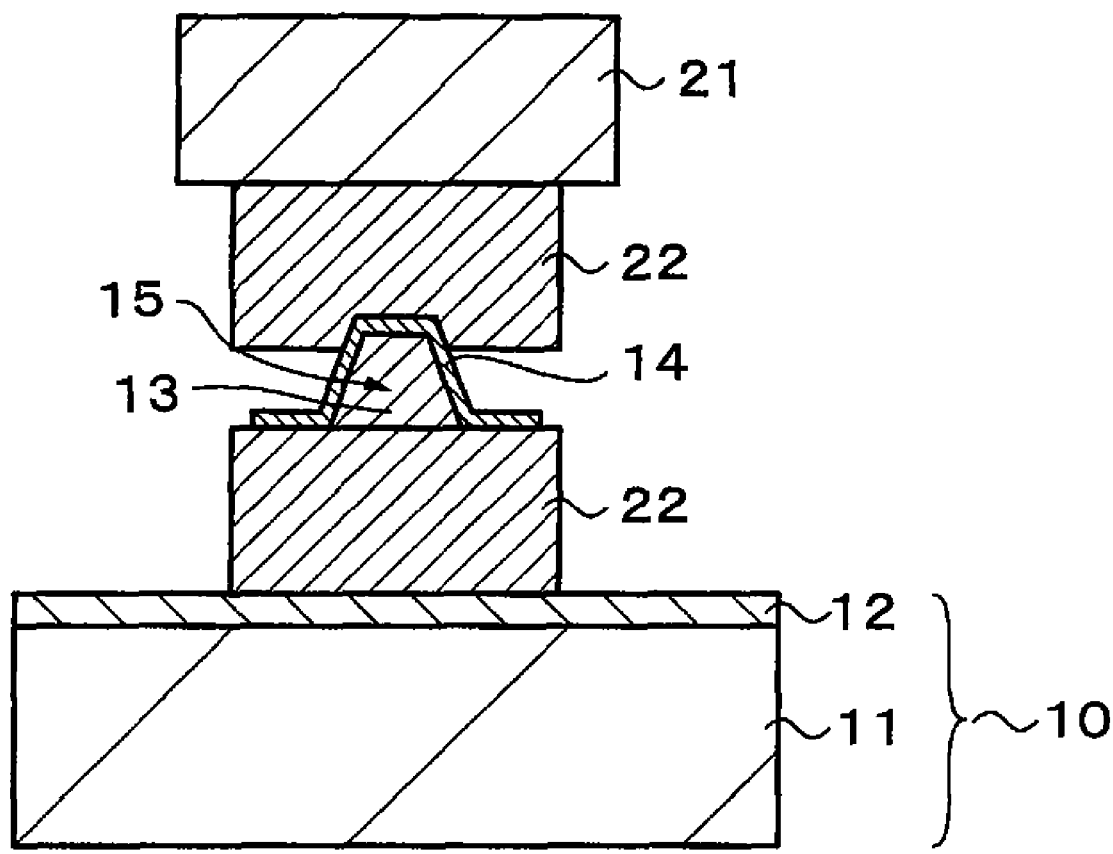
FIG. 26 is a sectional view showing a mounting structure in which a device is mounted by a mounting method according to still another embodiment.

Further, for example, as shown in FIG. 25, the bump 22 may be formed on the wiring 12 of the wiring board 10, and then the projection 15 may be formed on the bump 22. The device 20 includes the bump 22. FIG. 26 shows a mounting structure in which the device 20 is mounted on the wiring board 10 by pressure bonding. The device 20 and the wiring board 10 are bonded and fixed together by the adhesive 30.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An LED board comprising:
a wiring; and
at least one projection having a structure in which the surface of at least a tip part of a projecting section made of an elastic body is coated with a conductive film,
wherein a bottom surface of the elastic body is formed directly on the wiring,
wherein at least a portion of the elastic body is elastically deformed, and
wherein a portion of the projection is surrounded by a curable adhesive layer.

2. The LED board according to claim 1, wherein
the projection is arranged on the wiring in a state in which the wiring and conductive film are conducted to each other.

3. The board according to claim 1, wherein
wiring is arranged on the board, and the projecting section is arranged between the wiring and the board so as to be coated with the wiring, and a part laid over the projecting section of the wiring constitutes the conductive film.

4. The LED board according to claim 1, wherein the entire bottom surface of the elastic body is formed directly on the wiring.

5. A mounting structure comprising at least one device being mounted on an LED board including a wiring and at least one projection, the device including at least one bump, the projection having a structure in which the surface of at least a tip part of a projecting section made of an elastic body is coated with a conductive film,
wherein at least a tip part of the projection is buried in the bump,
wherein a bottom surface of the elastic body is formed directly on the wiring,
wherein at least a portion of the elastic body is elastically deformed, and wherein a portion of the projection is surrounded by a curable adhesive layer.

6. The mounting structure according to claim 4, wherein a part of the bump is surrounded by the curable adhesive layer.

7. An electronic device comprising one or a plurality of devices on an LED board, wherein at least one of the devices includes at least one bump, the board includes a wiring and at least one projection having a structure in which the surface of at least a tip part of a projecting section made of an elastic body is coated with a conductive film, wherein at least a tip part of the projection is buried in the bump, wherein a bottom surface of the elastic body is formed directly on the wiring, wherein at least a portion of the elastic body is elastically deformed, and wherein a portion of the projection is surrounded by a curable adhesive layer.

8. The electronic device according to claim 5, wherein a part of the bump is surrounded by the curable adhesive layer.

* * * * *